United States Patent
Mattila et al.

[11] Patent Number: 5,432,473
[45] Date of Patent: Jul. 11, 1995

[54] DUAL MODE AMPLIFIER WITH BIAS CONTROL

[75] Inventors: Heikki Mattila; Jorma Matero; Hannu Pakonen, all of Oulu, Finland

[73] Assignee: Nokia Mobile Phones, Limited, Salo, Finland

[21] Appl. No.: 92,245

[22] Filed: Jul. 14, 1993

[51] Int. Cl.⁶ .............................................. H03G 3/20
[52] U.S. Cl. .................................. 330/133; 330/134; 330/279; 455/126; 455/127
[58] Field of Search ............... 330/129, 133, 134, 279; 375/98; 455/116, 126, 127

[56] References Cited

U.S. PATENT DOCUMENTS

| | | | |
|---|---|---|---|
| 4,034,308 | 7/1977 | Wermuth et al. | 330/86 |
| 4,257,009 | 3/1981 | Yorkanis | 330/51 |
| 4,636,741 | 1/1987 | Mitzlaff | 330/127 |
| 4,901,032 | 2/1990 | Komiak | 330/277 |
| 4,924,191 | 5/1990 | Erb et al. | 330/130 |
| 4,955,083 | 9/1990 | Phillips et al. | 455/47 |
| 5,060,294 | 10/1991 | Schwent et al. | 455/93 |
| 5,121,081 | 6/1992 | Hori | 330/279 |
| 5,179,353 | 1/1993 | Miyake | 330/279 X |

FOREIGN PATENT DOCUMENTS 54-104760 8/1979 Japan .

Primary Examiner—James B. Mullins
Attorney, Agent, or Firm—Perman & Green

[57] ABSTRACT

A dual mode transmitter with bias control is described wherein an RF signal from a system modulator is fed to a gain control circuit, which can be either a voltage controlled amplifier or attenuator. The ultimate transmitter output power level depends on the attenuation/gain of the gain control circuit. The output signal from the gain control circuit is fed to a driver amplifier which amplifies the signal and feeds it to a power amplifier circuit, which may be comprised of several stages of bipolar transistors or GaAs FETs. The modulated signal to be transmitted is then fed from the power amplifier circuit through a coupler to an antenna terminal. The coupler is connected to an RF detector and is used for RF level monitoring. The Rf level signal from the RF detector is applied to a comparator circuit. An improved combination is provided by incorporating a bias control circuit. A Vpwr signal is applied as one input to the bias control circuit and a mode signal is applied as the other input. When the mode signal is "on" or present it signifies that the digital transmission mode is to be employed. When the mode signal is "off" or at zero level, it indicates that the analog transmission mode is to be employed. The bias control circuit provides three bias signal outputs, $V_{b1}$ applied to the driver amplifier, and $V_{b2}$ and $V_{b3}$, applied to the power amplifier. The levels of $V_{b1}$, $V_{b2}$ and $V_{b3}$ are varied for the analog and digital transmission modes.

7 Claims, 2 Drawing Sheets

DUAL MODE AMPLIFIER WITH BIAS CONTROL

BACKGROUND OF THE INVENTION

1. Field of the Invention

The present invention relates to dual mode radio frequency transmitters wherein both analog and digital data communication signals are transmitted, and more particularly to a dual mode transmitter circuit having an improved bias control.

2. Description of the Background Art

Heretofore, radio frequency data communication systems have utilized two different types of transmission modes, or dual modes, to transmit information to a receiver.

In U.S. Pat. No. 4,060,294 issued Oct. 22, 1991 to Schwent et al. and entitled DUAL MODE POWER AMPLIFIER FOR RADIO TELEPHONE, a transmission system is described wherein radio communication signals are both analog mode which are frequency modulated and discrete mode which are composite modulated as a combination of amplitude and phase modulation. In the Schwent et al. patent an amplifier is taught which may be alternately operated in the linear mode for the composite modulation and the saturation mode for the frequency modulation. A switch is provided which is connected to the amplifier to operate it in the linear or the saturation mode.

In U.S. Pat. No. 4,955,083 issued Sep. 4, 1990 to Philips et al. and entitled DUAL MODE RADIO TRANSCEIVER FOR AN SSB COMMUNICATION SYSTEM a radio transceiver is disclosed for use in an SSB communication system having FM data capability. The dual-mode radio transceiver includes a receiver capable of demodulating and deriving AFC from either the voice channel having voice messages transmitted via single sideband amplitude modulation with a pilot carrier, or the data channel having high speed data messages transmitted via narrowband frequency modulation in the same channel bandwidth. The dual-mode radio transceiver includes a transmitter capable of transmitting one of either of the above types of modulation on the appropriate channel, as determined by information received from the high speed data messages transmitted on the control channel.

In U.S. Pat. No. 4,924,191 issued May 8, 1990 to Erb et al. entitled AMPLIFIER HAVING DIGITAL BIAS CONTROL APPARATUS an amplifier is described that includes a digital bias control apparatus to provide dynamic control over the operating point of a plurality of amplifying elements in the amplifier. A processor is provided to optimize the operating point of each amplifying element as a function of the amplifying element characteristics.

In U.S. Pat. No. 4,247,009 issued Mar. 17, 1981 to Yorkanis entitled INHIBIT CIRCUIT FOR A DIFFERENTIAL AMPLIFIER a system is described including a pair of non-additive combiners (mixers) connected at their respective outputs to the inverting, and non-inverting, inputs of differential amplifier. A bias controller having an input for receiving a control signal produces a fixed bias voltage at a first output thereof and a variable bias voltage at a second output thereof. A conductor is connected to apply the variable bias voltage at the second output to the first inputs of non-additive combiners. A resistor is connected to apply the fixed vias voltage at the first output of the bias controller to a second input of the combiner.

U.S. Pat. No. 4,901,032 issued Feb. 13, 1990 to Komiak relates to a digitally controlled variable power amplifier for radio frequency signals for driving the individual elements of a phased array radar system in which accurate tapering of the power supplied to individual antenna elements is desired for sidelobe control. The power amplifier must maintain a stable phase transfer response and should remain at a high power transfer efficiency at each reduced power setting. This performance is achieved by the use of power transistor of a segmented dual gate design. The segments of the second gate electrode are of digitally scaled widths and are individually energized to activate digitally scaled regions of the transistor. These regions are operated in a saturated class "A" mode in all power settings to achieve the desired stable phase transfer response and high power added efficiency.

U.S. Pat. No. 4,034,308 issued Jul. 5, 1977 to Wermuth et al. entitled AMPLIFIER WITH CONTROLLABLE TRANSMISSION FACTOR AND SWITCHABLE CONTROL CHARACTERISTICS discloses an amplifier circuit whose gain bears a desired relation to a control voltage, including a differential amplifier, a plurality of impedances interconnected between the amplifier terminals and switches interconnected with the impedances and switchable between two states which create two impedance configurations that give the circuit mutually complementary gain vs. control voltage control characteristics.

U.S. Pat. No. 4,446,440 issued May 1, 1984 to Bell entitled DUAL MODE AMPLIFIER describes an amplifier apparatus amplifies a signal in two different modes. The apparatus amplifies the signal in a linear mode when the voltage of the signal is much less than the voltage of the power source, and in a switching mode when the signal is at other voltages.

U.S. Pat. No. 4,121,081 issued Jun. 9, 1992 to Hori entitled OUTPUT WAVEFORM CONTROL CIRCUIT discloses an output waveform control circuit for a time division multiple access system including driving circuit which sends a control signal to a power amplifier in accordance with a signal outputed by a comparator circuit. By controlling the operating voltage of the power amplifier simultaneously with the control of the level input signal from the input level control circuit, the output characteristic of the power amplifier, including a class C or the like amplifier having a non-linear input/output characteristic, is prevented from varying abruptly, and the output waveform of the power amplifier is so controlled as to have gently sloped leading and trailing edges.

In Japanese Patent Publication SS4(1979) 104760 dated Aug. 17, 1979 by Hikari Honda and entitled A LOW POWER CONSUMPTION TYPE AMPLIFIER a low power consumption type amplifier is described that is provided with an amplifier circuit which amplifies a specified wideband signal, a signal level detector circuit which detects the signal level of this amplifier circuit, and a variable-impedance circuit where the impedance is varied and controlled by means of the output of the said signal level detector circuit, and which by way of the said impedance supplies power of a specified voltage to the aforementioned amplifier circuit, thereby controlling the said variable-impedance circuit so that the aforementioned impedance is caused to be small when the aforementioned signal level is high, and high when the signal level is low.

SUMMARY OF THE INVENTION

An object of the present invention is to provide a dual mode transmitter circuit for digital cellular telephone transmission which has a linear transmitter.

Another object of the present invention is to provide a linear dual mode transmitter including an improved biasing control circuit for saving battery power and providing good talk time properties.

A further object of the present invention is to provide an improved dual mode transmitter for operation in analog and digital modes.

Still another object of the present invention is to provide a dual mode transmitter wherein high power and low idle current is provided in the analog mode and high linearity with optimum D.C. power (idle current) is provided in the digital mode. Optimum idle current in both operation modes is set for desired transmitter power level.

A still further object of the present invention is to provide a dual mode transmitter including a bias control circuit which applies first level bias signals to the transmitter amplifiers for analog mode transmission and second level bias signals to the transmitter for digital mode transmission.

DESCRIPTION OF THE PREFERRED EMBODIMENT

Figure 1:
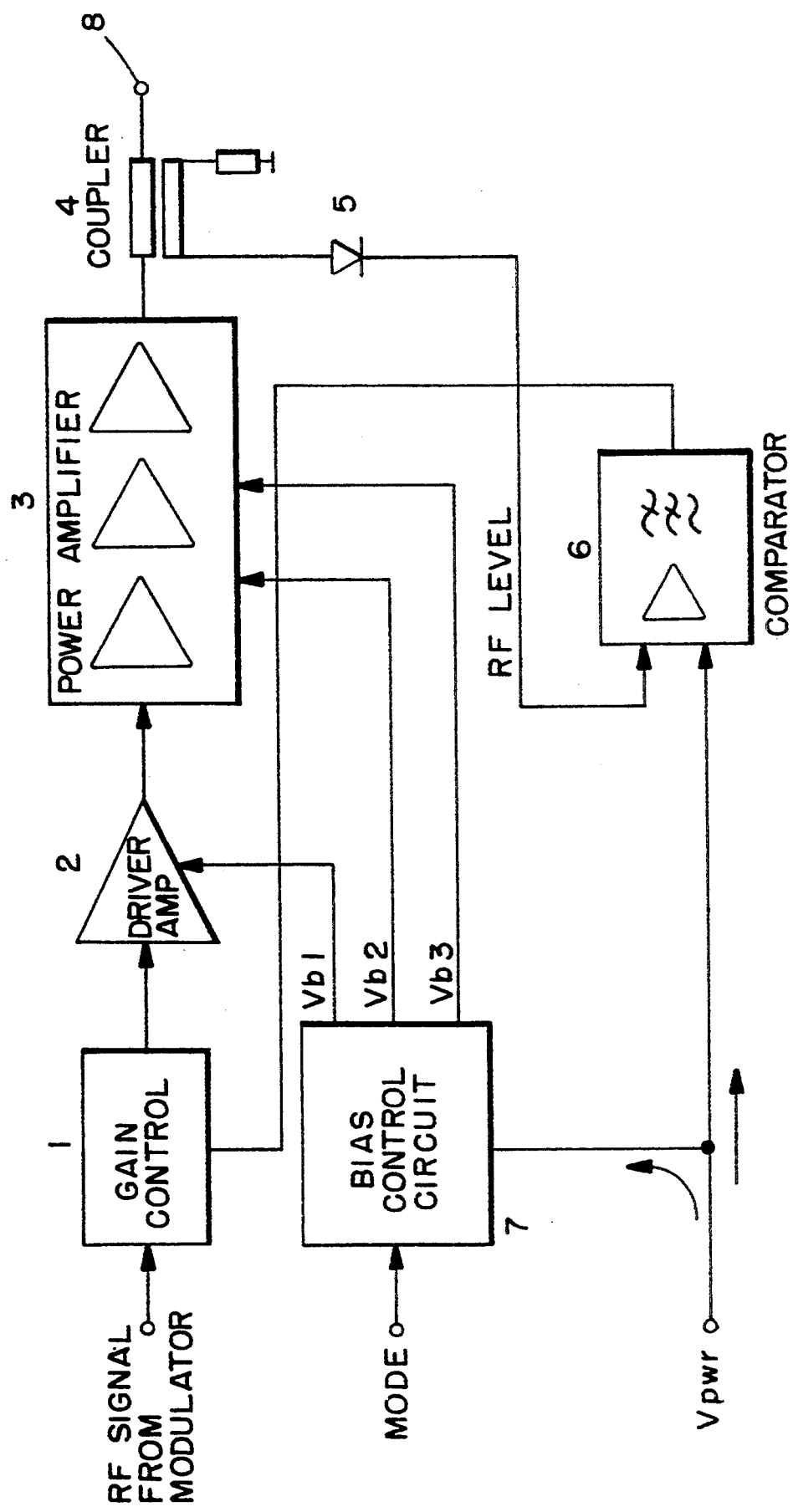
FIG. 1 is a schematic block diagram of a dual mode transmitter for efficient transmission of digital and analog communication signals according to the principles of the present invention.

Referring to FIG. 1, a schematic block diagram of an embodiment of a dual mode transmitter according to the present invention is illustrated including a gain control means 1, a driver amplifier 2, a power amplifier 3, a coupler 4, an RF detector 5, a comparator 6, a bias control circuit 7 and an antenna terminal 8.

The signal to be transmitted, an RF input signal from the system modulator, is fed to the gain control means 1. Gain control means can be either a voltage controlled amplifier or attenuator employing FETs or PIN-diodes. The ultimate transmitter output power level depends on the attenuation/gain of the gain control means stage 1. The output signal from gain control means 1 is fed to driver amplifier 2 which amplifies the signal and feeds it to power amplifier means 3. The power amplifier means 3 may be comprised of several stages of bipolar transistors or GaAs FeTs. The modulated signal to be transmitted is then fed from power amplifier 3 through coupler 4 to the antenna terminal 8.

The coupler 4 is connected to an RF detector 5 and is used for RF level monitoring. The RF level signal from RF detector 5 is applied to comparator circuit 6.

The comparator circuit 6 is part of a control loop for transmitter RF power control. The RF level signal from detector 5 is compared with a Vpwr signal at comparator 6. The Vpwr signal is the desired system transmitting power level. The output signal from comparator circuit 6 is the difference between the actual monitored RF level signal from detector 5 and the desired Vpwr signal. The difference output signal from comparator circuit 6 is fed back to gain control means 1 to regulate the gain (increase or attenuate) in gain control means 1 until the RF output signal level at antenna terminal 8 is equal to the level of the Vpwr signal. At this point the desired RF output signal level at the antenna terminal 8 is achieved.

The concept of monitoring of the RF output level of a transmitter and feeding back a gain control signal to vary the gain and the output level is known in the prior art. However, in FIG. 1, an improved combination is provided by incorporating the bias control circuit 7. The Vpwr signal is also applied as an input to bias control circuit 7. The other input signal to bias control circuit 7 is a mode signal. When the mode signal is "on" or present it signifies that the digital transmission mode is to be employed. When the mode signal is "off" or at zero level, it indicates that the analog transmission mode is to be employed. The bias control circuit provides three bias signal outputs, $V_{b1}$ applied to driver amplifier 2 and $V_{b2}$ and $V_{b3}$ applied to power amplifier 3.

Figure 2:
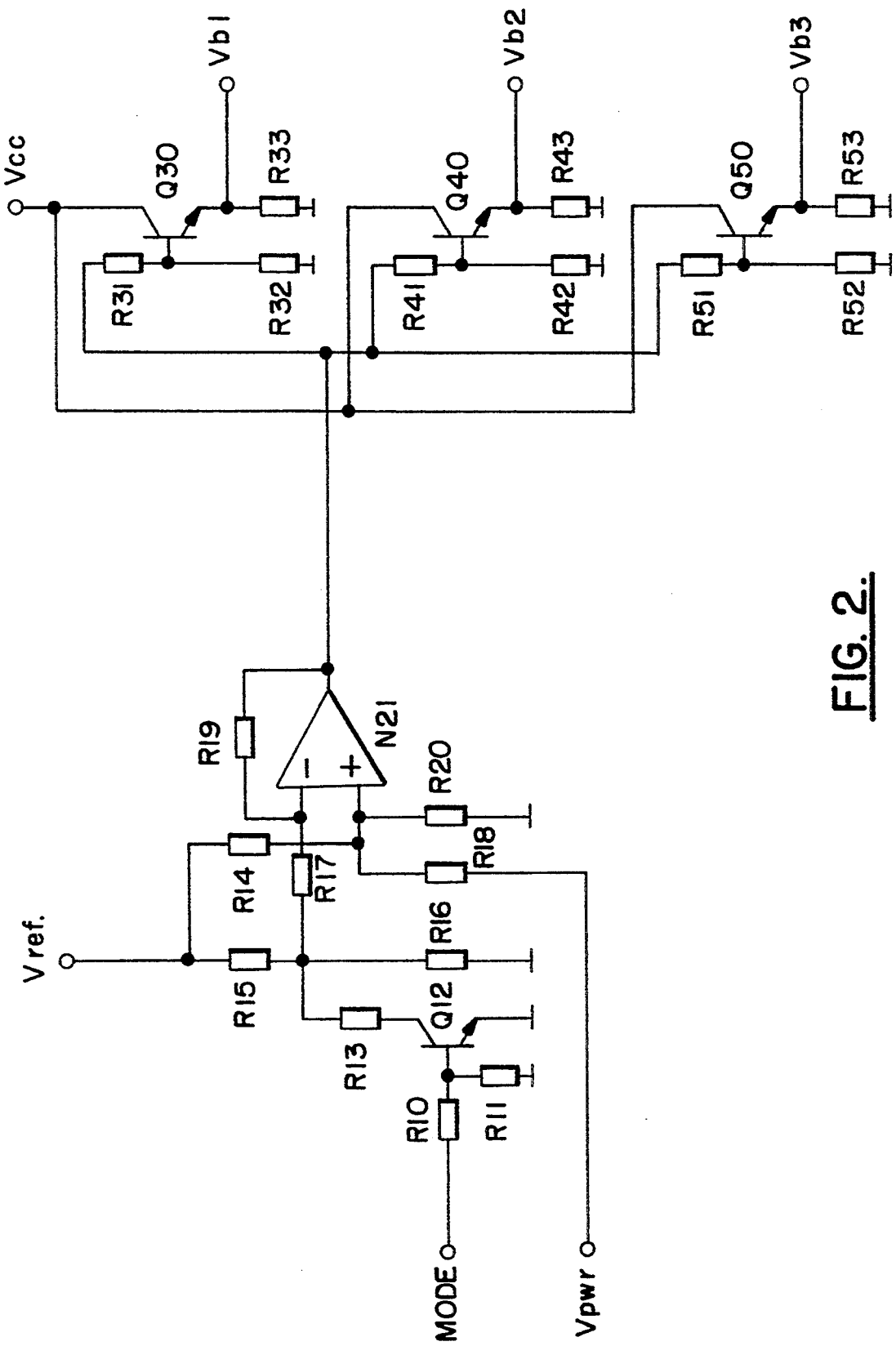
FIG. 2 is a schematic circuit diagram of an embodiment of a bias control circuit employed in the transmission system of FIG. 1.

Referring to FIG. 2, an embodiment of the bias control circuit 7 is illustrated. The mode input signal is shown connected through resistor combination R10 and R11 to the base of transistor device Q12. Transistor Q12 is connected through resistors R13 and R17 to a first input lead of operational amplifier N21 connected with resistor R19 in a differential amplifier configuration. The first input lead of operational amplifier 21 is also connected to a voltage divider circuit composed of a voltage source Vref, resistor R15 and resistor R16.

The Vpwr input signal is applied through resistor R18 to the second input of operational amplifier N21. The second input lead to operational amplifier N21 is also connected to a voltage divider circuit composed of Vref, resistor R14 and resistor R20. Being an operational amplifier, the output of amplifier 21 is the signal on the second input lead minus the signal on the first input lead, referred to as the inverting input.

When the transmission mode is "analog" the mode input signal is zero and transistor Q12 does not conduct. The output voltage of the operational amplifier N21 is a function of the input signal to the first input lead which is Vref divided by resistors R15 and R16 and the Vpwr input signal to the second input lead. When the power level Vpwr is increased, the output voltage of amplifier N21 will increase accordingly.

In the "digital" transmission mode, there is a signal present on the mode input causing transistor Q12 to conduct and the signal level on the first input lead (the inverting input) of amplifier N21 decreases. This causes an increase in the output voltage of amplifier N21 and if Vpwr is at its highest value, the output voltage from amplifier N21 will be maximum. The maximum bias voltage is connected to the amplifiers and causes full idle current to flow in the RF amplifiers.

More particularly, the output of the operational amplifier N21 is connected to three emitter follow devices Q30, Q40 and Q50 with outputs $V_{b1}$, $V_{b2}$ and $V_{b3}$ respectively which, as illustrated in FIG. 1, are used as bias input signals for individual amplifier stages. Resistors R31 and R32 are used for scaling the output $V_{b1}$, resistors R41 and R42 are used for scaling voltage $V_{b2}$ and resistors R51 and R52 are used for scaling voltage $V_{b3}$.

Thus, the bias control circuit 7 employs a mode signal ("on" for the digital mode, "off" for the analog mode)

and the desired power level signal Vpwr as inputs and provides bias voltages $V_{b1}$, $V_{b2}$ and $V_{b3}$ to the individual amplifier stages to set the idle currents. The highest idle currents are for the highest power level in the digital mode. For lower power levels in the digital transmission mode, the bias voltages $V_{b1}$, $V_{b2}$, $V_{b3}$ are set simultaneously with the power level, with the control provided by Vpwr.

In the analog transmission mode the idle currents are reduced because the mode signal is zero and transistor Q12 does not conduct which causes a higher level signal to be present on the first input lead (the inverting input) to amplifier N21, thereby lowering the level of the output signal from amplifier N21 which is applied to transistors Q30, Q40 and Q50, resulting in low levels of bias signals $V_{b1}$, $V_{b2}$ and $V_{b3}$.

A biasing control circuit for a dual transmitter amplifier has therefore been provided which permits efficient operation in both the analog and digital modes of the transmitter. In the analog mode, high power and low idle current is provided, and in the digital mode high linearity with optimum D.C. power (idle current) is provided.

While the invention has been particularly shown and described with respect to a preferred embodiment thereof, it will be understood by those skilled in the art that changes in form and details may be made therein without departing from the scope and spirit of the invention.

We claim:

1. An amplifier structure for a dual mode signal transmission system of the type wherein modulated signals are transmitted in a digital or analog transmission mode comprising:
   a gain control means responsive to a modulated signal for varying the amplitude of said modulated signal,
   an amplifier circuit means including a plurality of amplifier stages connected to the output of said gain control means for amplifying said modulated signal,
   an antenna output terminal connected to said amplifier circuit means for coupling said modulated signal to a transmission antenna,
   a source of voltage Vpwr representative of the desired signal level for the modulated signal coupled to said antenna output terminal,
   a feedback circuit means connected to the said antenna output terminal, said source of voltage Vpwr and said gain control means for comparing the level of said modulated signal and the level of said Vpwr signal and providing a difference signal value exclusively to said gain control means
   and a bias control signal means having first and second input terminals and a plurality of output terminals, said first input terminal being connected to said source of Vpwr signal, said second terminal being connected to a dual state mode signal, and said plurality of output terminals being connected exclusively to said amplifier means,
   wherein said bias control means is responsive to said Vpwr signal and to said dual state mode signal in a first state for producing bias signals on said plurality of output terminals for biasing said amplifier means at first bias levels for analog mode transmission, and said bias control means is responsive to said Vpwr signal and to said dual state mode signal in a second state for producing bias signals on said plurality of output terminals for biasing said amplifier means at second bias levels for digital mode transmission.

2. An amplifier structure for a dual mode signal transmission system wherein modulated signals are transmitted in a digital or analog transmission mode according to claim 1 wherein said feedback circuit means includes:
   a signal comparator means having first and second input terminals, and an output terminal connected exclusively to said gain control means,
   a signal coupler means connected to the output of said amplifier circuit means and to one of said input terminals of said comparator means for coupling the signal level of said modulated signal from said amplifier circuit means to said comparator means, said source of voltage Vpwr being connected to said second input terminal of said comparator means wherein said comparator means produces an output signal representative of the difference between said level of said Vpwr signal and the level of said output signal from said amplifier circuit means, said difference signal being connected to said gain control means for adjusting said gain control means to vary said modulated signal until said output signal from said amplifier circuit means is at the same level as said Vpwr signal and said difference signal from said comparator is zero.

3. An amplifier structure for a dual mode signal transmission system according to claim 2, said bias control signal means including an operational amplifier means having first and second input leads and an output lead wherein said operational amplifier amplifies the difference between signals applied to said first and second input leads thereof to provide a difference output signal on said output lead,
   a switching transistor connected to said first input lead of said operational amplifier,
   said source of voltage Vpwr being connected to said second input lead of said operational amplifier,
   said dual state mode signal being connected to said switching transistor for turning said switching transistor off when said dual mode state mode signal is in said first state for analog transmission and for turning said switching transistor on when said dual state mode signal is in said second state for digital transmission.

4. An amplifier structure for a dual mode signal transmission system according to claim 3 wherein, when said switching transistor is off for analog transmission, said first input lead to said operational amplifier is at a high level producing a difference output signal on said operational amplifier output lead at a low, analog transmission mode bias level and wherein, when said switching transistor is on for digital transmission, said first input lead to said operational amplifier is at a low level producing a difference output signal on said operational amplifier output lead at a high, digital transmission mode bias level.

5. An amplifier structure for a dual mode signal transmission system according to claim 4 wherein bias control signal means further includes a bias signal scaling means connected to said output lead of said operational amplifier, said bias signal scaling means including a plurality of separate output leads, said bias signal scaling means being responsive to and scaling said low level analog transmission mode bias output signal on said operational amplifier output lead for selectively providing a plurality of low level analog transmission mode bias signals on said separate output leads of said bias signal scaling means, and said bias signal scaling means being responsive to and scaling said high level digital transmission mode bias output signal on said operational amplifier output lead for selectively providing a plurality of high level digital mode bias signals on said separate output leads of said bias signal scaling means.

6. An amplifier structure for a dual mode signal transmission system according to claim 5 wherein said plurality of separate output leads of said bias signal scaling means are connected to said plurality of amplifier stages of said amplifier means for adjusting the gain of said amplifier means in response to said Vpwr voltage signal and said dual state mode signal.

7. An amplifier structure for a dual mode signal transmission system according to claim 6 wherein said bias signal scaling means includes a plurality of transistor devices each including collector emitter and base electrodes, each of said base electrodes of said transistor devices being connected to said operational amplifier output lead by a combination of scaling resistors wherein separate signal level values are applied to separate ones of said base electrodes.

* * * * *